(12) United States Patent
Coglitore

(10) Patent No.: US 7,173,821 B2
(45) Date of Patent: Feb. 6, 2007

(54) COMPUTER RACK WITH POWER DISTRIBUTION SYSTEM

(75) Inventor: Giovanni Coglitore, Los Gatos, CA (US)

(73) Assignee: Rackable Systems, Inc., Milpitas, CA (US)

( * ) Notice: Subject to any disclaimer, the term of this patent is extended or adjusted under 35 U.S.C. 154(b) by 131 days.

(21) Appl. No.: 10/464,028

(22) Filed: Jun. 17, 2003

(65) Prior Publication Data

US 2004/0228087 A1 Nov. 18, 2004

Related U.S. Application Data

(60) Provisional application No. 60/471,430, filed on May 16, 2003.

(51) Int. Cl.
*H05K 7/20* (2006.01)
*H01R 12/16* (2006.01)

(52) U.S. Cl. ............... 361/695; 307/65; 361/691; 361/693; 361/698; 361/788

(58) Field of Classification Search ............ 307/65; 361/695, 788, 691, 693, 698
See application file for complete search history.

(56) References Cited

U.S. PATENT DOCUMENTS

| | | | |
|---|---|---|---|
| 4,691,274 A | * | 9/1987 | Matouk et al. ............ 363/141 |
| 5,173,819 A | * | 12/1992 | Takahashi et al. ....... 360/97.03 |
| 5,206,772 A | * | 4/1993 | Hirano et al. ............ 360/98.01 |
| 5,460,441 A | | 10/1995 | Hastings et al. |
| 5,505,533 A | | 4/1996 | Kammersqard et al. |
| 5,528,454 A | | 6/1996 | Niklos |
| 5,813,243 A | | 9/1998 | Johnson et al. |
| 5,822,182 A | | 10/1998 | Scholder et al. |
| 5,877,938 A | | 3/1999 | Hobbs et al. |
| 6,005,773 A | | 12/1999 | Rozman et al. |
| 6,014,319 A | * | 1/2000 | Kuchta et al. ............ 361/788 |
| 6,066,900 A | | 5/2000 | Chan et al. |
| 6,078,503 A | * | 6/2000 | Gallagher et al. ......... 361/725 |
| 6,088,224 A | | 7/2000 | Gallagher et al. |
| 6,098,131 A | | 8/2000 | Unger et al. |

(Continued)

OTHER PUBLICATIONS

Brian. "What are amps, watts, volts and ohms?" located at http://science.howstuffworks.com//question501.htm/printable> visited on Jul. 30, 2003. (2 pages).

(Continued)

*Primary Examiner*—Brian Sircus
*Assistant Examiner*—Hal I. Kaplan
(74) *Attorney, Agent, or Firm*—Morrison & Foerster LLP

(57) ABSTRACT

The invention relates to a computer rack, frame or system having a direct current power supply positioned at the upper portion of the rack. In one variation, the DC power supply is placed in the highest shelf in the computer rack. In another variation, the DC power supply is placed on top of the computer rack. In yet another variation, a dual column computer rack with a back-to-back configuration is implemented with DC power supplies placed in a top shelf of the one of the computer columns. The DC power supply may comprise of one or more direct current power supply modules configured to provide fail over protection. In another aspect of the invention, the power supply modules are placed in a separate rack and provide direct current to support computers in one or more computer racks.

29 Claims, 7 Drawing Sheets

U.S. PATENT DOCUMENTS

| | | | |
|---|---|---|---|
| 6,141,213 A | | 10/2000 | Antonuccio et al. |
| 6,157,534 A | * | 12/2000 | Gallagher et al. ........... 361/683 |
| 6,181,552 B1 | | 1/2001 | Neville, Jr. et al. |
| 6,259,605 B1 | | 7/2001 | Schmitt |
| 6,301,095 B1 | | 10/2001 | Laughlin et al. |
| 6,331,933 B1 | | 12/2001 | Rumney |
| 6,421,259 B1 | | 7/2002 | Brooks et al. |
| 6,445,586 B1 | * | 9/2002 | Chou ......................... 361/725 |
| 6,459,175 B1 | * | 10/2002 | Potega ....................... 307/149 |
| 6,496,366 B1 | | 12/2002 | Coglitore et al. |
| 6,564,571 B2 | * | 5/2003 | Feeney ....................... 62/259.2 |
| 6,621,707 B2 | * | 9/2003 | Ishimine et al. ............. 361/721 |
| 6,826,036 B2 | * | 11/2004 | Pereira ....................... 361/624 |
| 7,002,265 B2 | * | 2/2006 | Potega ....................... 307/149 |
| 2002/0062454 A1 | | 5/2002 | Fung |
| 2002/0124128 A1 | | 9/2002 | Qiu |
| 2002/0134098 A1 | * | 9/2002 | Feeney ....................... 62/259.2 |
| 2002/0134567 A1 | | 9/2002 | Rasmussen et al. |
| 2003/0005339 A1 | | 1/2003 | Cohen et al. |
| 2003/0016504 A1 | | 1/2003 | Raynham |
| 2003/0030988 A1 | | 2/2003 | Garnett et al. |
| 2003/0112647 A1 | * | 6/2003 | Liu et al. .................... 363/144 |
| 2003/0121689 A1 | * | 7/2003 | Rasmussen et al. .......... 174/50 |
| 2003/0231476 A1 | * | 12/2003 | Vinson et al. .............. 361/798 |

OTHER PUBLICATIONS

Brown. "How PC Power Supplies Work," located at http://www.howstuffworks.com/power-supply.htm/printable> visited on Jul. 30, 2003. (6 pages).

Curatolo. "High-Density Power Components Add Flexibility to Distributed-Power Design," located at http://www.elecdesign.com/2000/jun1200/desapps/3DESAPPI.shtml?ads=power visited on Mar. 18, 2003. (8 pages).

Gobbi. "Power Solutions That Meet Telecomm Requirements," located at http://www.energynusernews.com/CDA/ArticleInformation/features/BNP_Features_tem/0,2584,63326,00.html visited on Jul. 30, 2003. (5 pages).

Okada. "Modular Power Supplies: Standard Converter modules offer tremendous benefits for distributed or centralized power architectures," located at http://www.roassoc.com visited on Jul. 30, 2003, published in 1998. (2 pages).

"VRMs for Distributed Power Architecture Applications," located at http://www.smartm.com/memdigest/march2002/html/march_2002_hot_topic.html> visited on Jul. 30, 2003. (3 pages).

* cited by examiner

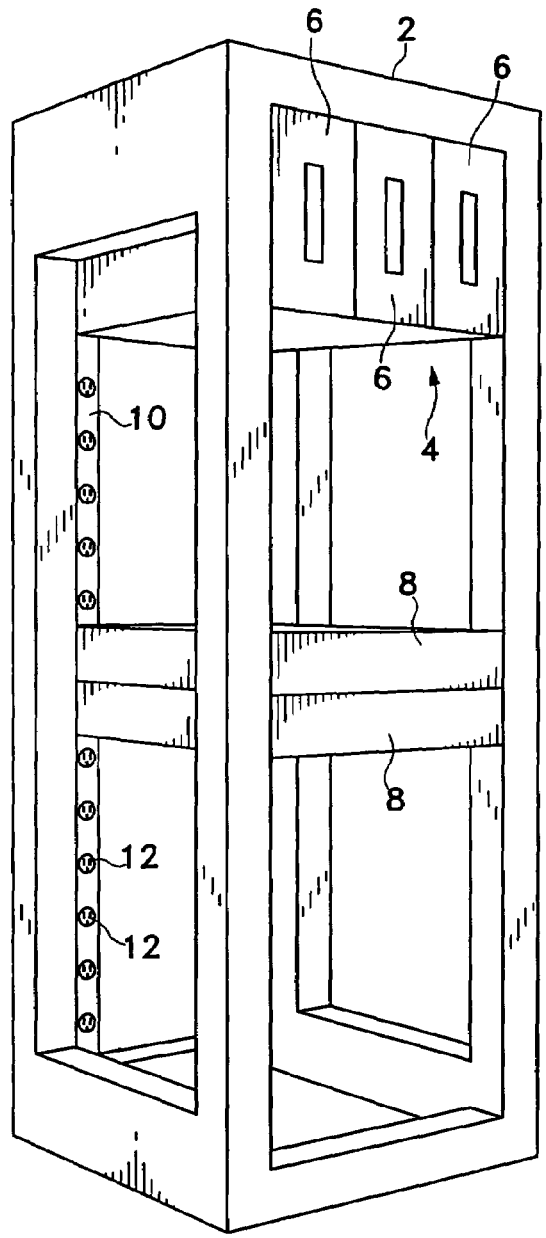
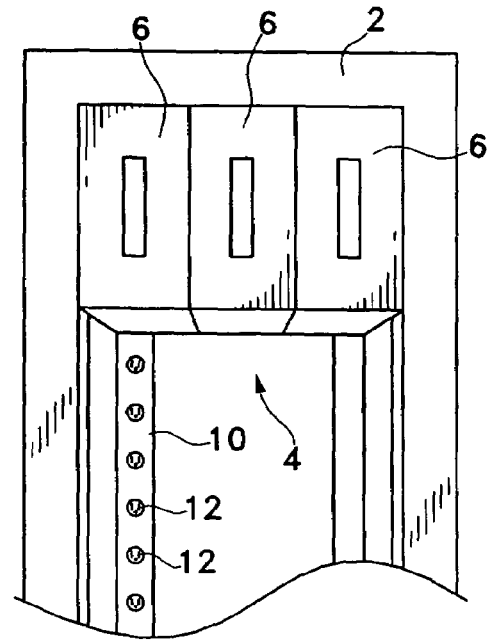
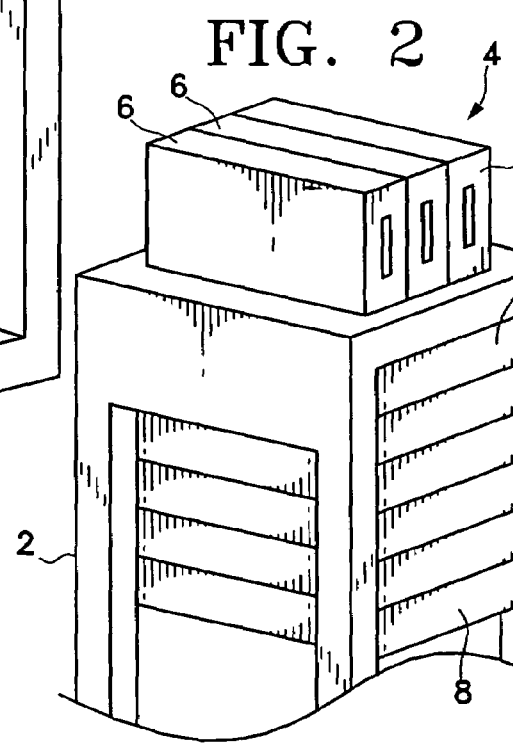
FIG. 1A
FIG. 1B
FIG. 2

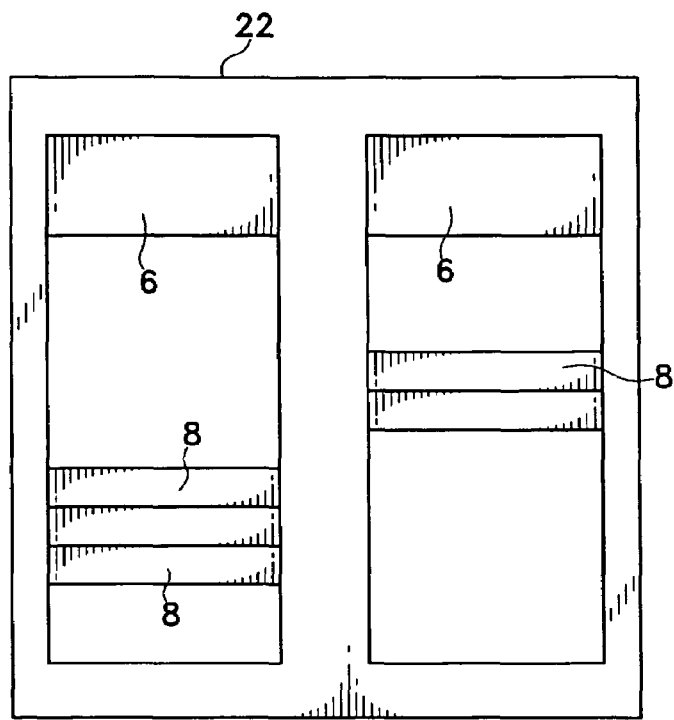
FIG. 3A
FIG. 3B
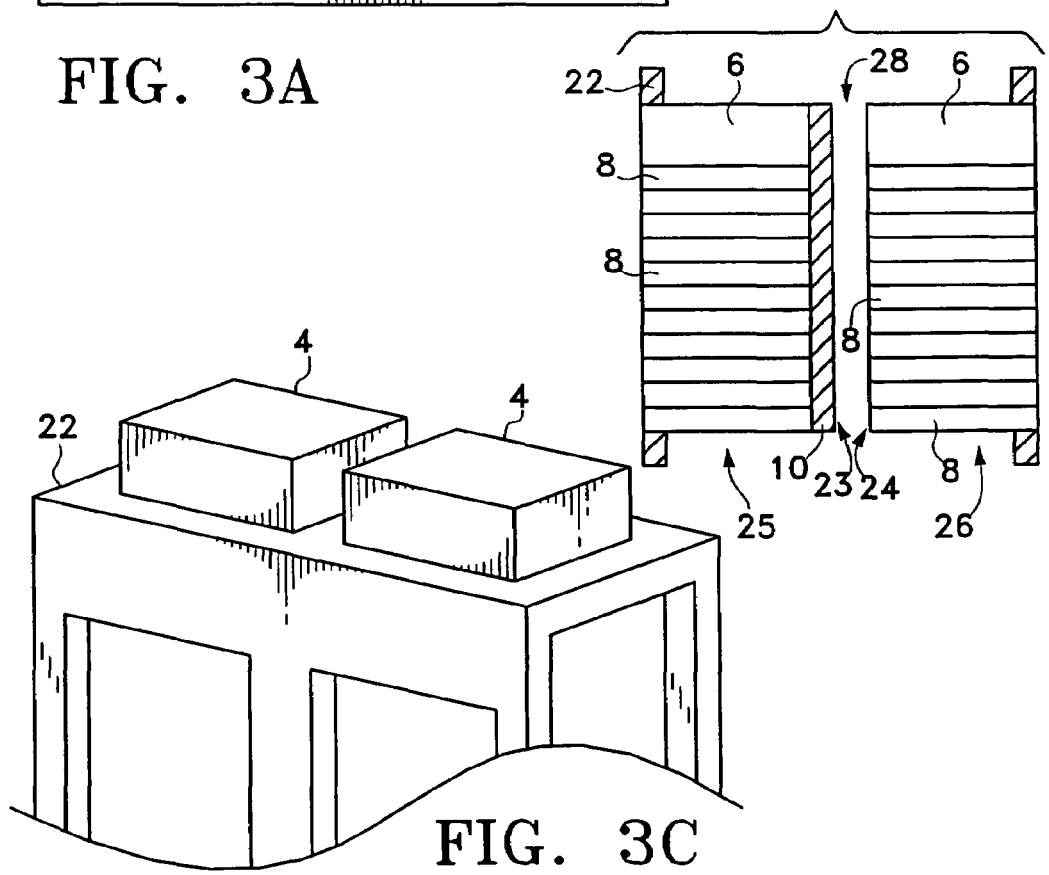
FIG. 3C

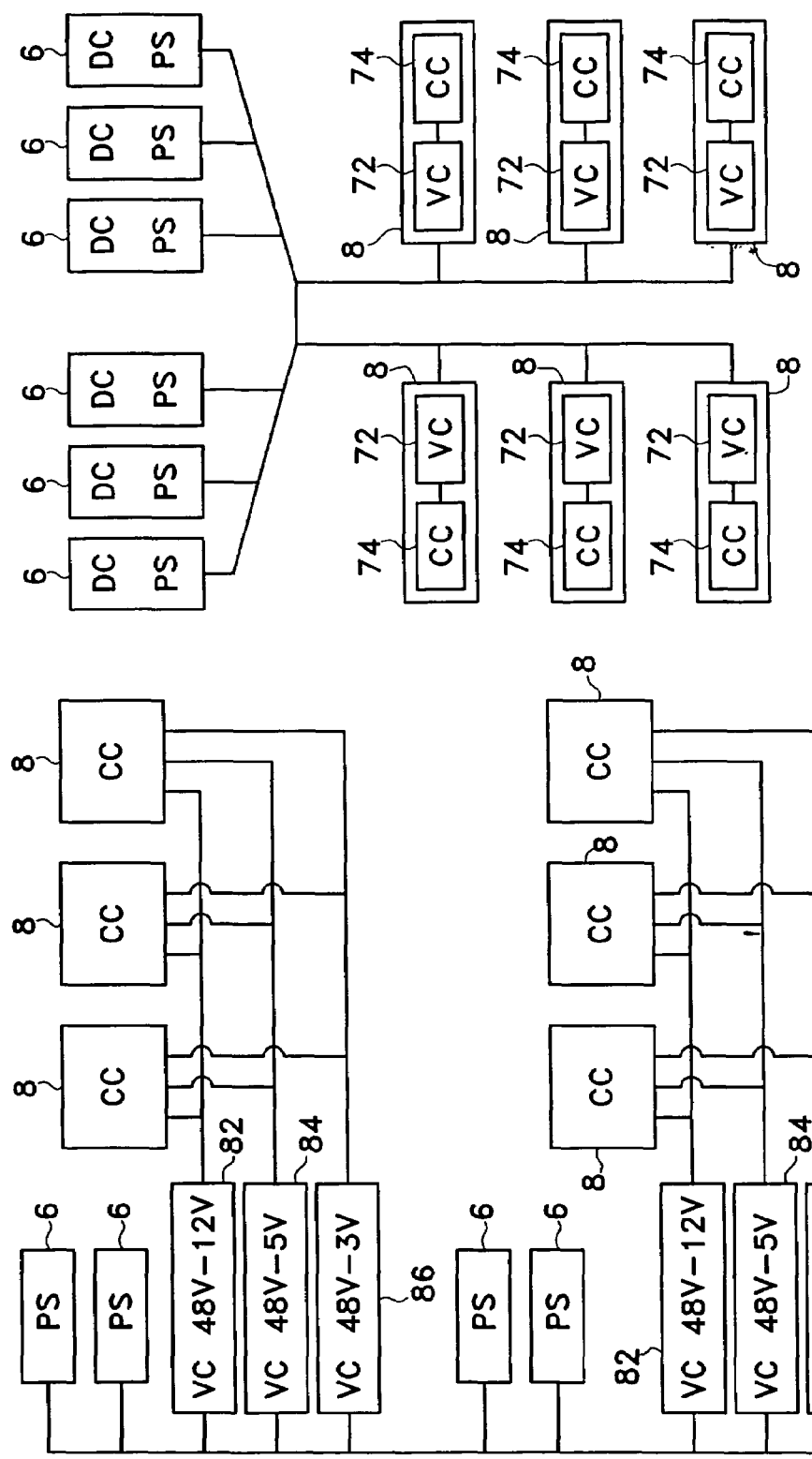

COMPUTER RACK WITH POWER DISTRIBUTION SYSTEM

CROSS-REFERENCE TO RELATED APPLICATIONS

This application is claiming the benefit of priority to U.S. provisional application Ser. No. 60/471,430 entitled "COMPUTER RACK WITH POWER DISTRIBUTION SYSTEM" filed May 16, 2003, which is incorporated herein by reference in its entirety.

FIELD OF THE INVENTION

This invention relates to the manner in which computers are configured and provided in a given area in order to conserve space and deal with cooling issues associated with housing a large number of computers. Aspects of the invention assist with increasing the density at which computers may be provided, particularly in a network server or host environment. In particular, a power supply unit for supporting the electrical needs of the various computers in a computer rack may be utilized to improve heat dissipation of a multi-computer system house in the computer rack.

BACKGROUND OF THE INVENTION

As information technology has rapidly progressed in the past ten years, the role of computer network centers such as server farms and server clusters have became increasingly important to our society. The server farms provide efficient data storage and data distribution capability that supports a worldwide information infrastructure, which has come to dominate how we live and how we conduct our day to day business.

A server farm is a group or cluster of computers acting as servers and housed together in a single location. For example, a Web server farm may be either a Web site that has more than one server, or an Internet service provider that provides Web hosting services using multiple servers. In a business network, a server farm or cluster might perform such services as providing centralized access control, file access, printer sharing, and backup for workstation users.

To take advantage of economies of scale, the number of computers hosted in server farms has continued to grow over the past ten years. This has lead to an increasing need for space in which to house the network host units and a consolidation of spaces where they are located. Sites known as co-location sites where numerous networked computers find a home have emerged to meet this market demand. Space for the computers is typically rented at such sites. Rent calculations may be based on the overall space occupied, power consumption and bandwidth handled by the computers occupying the space. Because of the relationship between such factors, it will often be in favor of both a co-location site and computer service provider to maximize both the density and performance efficiency of the computers at a given site. By increasing the density at which computers may be packed into a given area, the service provider benefits as less space is required for a given number of computers; the co-location site benefits since the ultimate bandwidth available in association with the space available may be greatly increased.

Other less apparent benefits stem from conserving the space a host computer occupies. In many instances, it will be economically feasible to forestall the retirement of otherwise outdated host computers since the cost of the space they occupy is relatively lower, thereby justifying their continued service for a period of time. On the other hand, where it is preferred to only maintain the highest-end computers in service, the savings available by minimizing the size of such computers without hindering performance is quite clear. There exists a need for computer systems adapted for realizing these many advantages.

Typically, at a site where numerous computers are connected to a network, the computers are stacked in racks and arranged in repeating rows or cells. Access to the computers is necessary for servicing, upgrading hardware, loading software, attaching cables, switching power on and off, and so forth. The elimination of as much access space as is feasible can increase the density of computer systems that may be provided for a given square footage of area at a site. Consequently, there exists a need to eliminate extraneous access space while still maintaining the use of relatively inexpensive, standard (or more-or-less standard size) racks.

In the market today, a standard rack that is widely used measures roughly 19 inches wide, 30 inches deep and 74 inches high. In at least one co-location site, these racks are lined up in rows of roughly 10–30 units with access doors on each side of a rack. Access aisles are provided on both sides of the rows. Many of the racks are filled with cumbersome computers mounted on sliders which are attached through mounting holes provided in the front and back of the rack. Regardless of the chassis design of the computers (or lack thereof where computers are merely built on open trays with their components uncovered) and how they are mounted to the racks, data devices included in the computer are accessed from the front. Main board I/O's, other I/O's, power cords and such items are typically accessed from the back. It is this latter design aspect which not only results in inefficiency in the amount of access space required, but also in the frequent inefficiencies associated with having to administer services to both sides of a computer. Consequently, there exists a need for computers useable in a network setting that are accessible and fully serviceable from a single side.

Various solutions for stacking computers have been proposed over the years. Examples of such devices are disclosed in U.S. Pat. No. 5,460,441, titled "RACK-MOUNTED COMPUTER APPARATUS" issued to Hastings et al., dated Oct. 24, 1995; U.S. Pat. No. 6,078,503, titled "PARTITIONABLE CABINET" issued to Gallagher et al., dated Jun. 20, 2000; U.S. Pat. No. 6,301,095 B 1, titled "SYSTEM AND METHOD OF DISTRIBUTING POWER TO A PLURALITY OF ELECTRONIC MODULES HOUSED WITHIN AN ELECTRONIC CABINET" issued to Laughlin et al., dated Oct. 9, 2001; U.S. Pat. No. 6,496, 366 B1, titled "HIGH DENSITY COMPUTER EQUIPMENT STORAGE SYSTEM" issued to Coglitore et al., dated Dec. 17, 2002; U.S. Patent Publication No. US 2002/ 0062454 A1, titled "DYNAMIC POWER AND WORKLOAD MANAGEMENT FOR MULTI-SERVER SYSTEM" by Fung, dated May 23, 2002; U.S. Patent Publication No. US 2002/0134567 A1, titled "ADJUSTABLE SCALEABLE RACK POWER SYSTEM AND METHOD" by Rasmussen et al., dated Sep. 26, 2002; U.S. Patent Publication No. US 2003/0016504 A1, titled "SEVER SYSTEM WITH REMOVABLE SERVER CARTRIDGES" by Raynham, dated Jan. 23, 2003; and U.S. Patent Publication No. US 2003/0030988 A1, titled "COMPUTER SYSTEM" by Garnett et al., dated Feb. 13, 2003; each of which is incorporated here in by reference in its entirety.

As the number of computers in a server farm is increased, two competing factors come into play: consumption of floor space and heat/ventilation management. To increase the number of computers at a given server farm without increasing the density of the computers means one would need more space. As the cost of real estate continue to rise, especially in the urban areas where population density is high, there is a strong incentive to maximize the utilization of a given space. Furthermore, in some existing server farm facilities, there is no more space available for scaleable growth. In such a situation, in order to expand, one would have to absorb the cost of starting a new server farm.

Alternatively, one may try to increase the number of computers that are housed in a given space. In order to significantly increase the density of computers in a given space, one common solution has been to shrink the size of each individual computer in the rack. Another option is to decrease the space between the racks that are holding the stacks of computers.

However, as one increases the density of computers, problems associated with heat dissipation rises exponentially. One of the major causes of electronic component failure is overheating. High performance electronics such as CPUs generate substantial amounts of heat. Additionally, next generation processors are emitting substantially more heat as computing requirements increases. Thereby placing further demands on effective heat dissipation. In order for computers to continue to operate properly, appropriate heat dissipation pathways must be provided. Because each computer contains thousands of heat producing electronic parts, as one increases the density of the computers, one must also address the difficult issues of providing proper cooling mechanisms to remove heat from the individual computer nodes and the clusters as a whole.

Power supplies also generate a significant amount of heat relative to the other electronic components in a computing unit, the traditional configurations of having power supplies distributed throughout every computing unit in the computer rack has many drawbacks in management of thermal levels at the individual computer node level as well as cluster level. The power supplies contribute to significant heat built up at every level of the computer rack where an individual computing unit is located. In order to cool the power supply, a separate fan is often implemented just to remove heat around the power supply. The power supply fan itself contributes to additional heat generation. Because hot air rises upward due to its buoyancy, heat generated at the power supply located at a lower level or slot on a computer rack will need to pass through or around the computing units situated above it, which themselves also have excess heat to be removed due to heat generated by their own power supplies and electronic components.

A multi-computer platform computing system that redistributes power supplies in a computer rack and facilitates heat removal from individual computing units housed in the computer rack, may provide a significant advantage to both the efficiency of each individual computing unit within the rack and the efficiency of the computing system as a whole. Since management of heat generation and the ability to cool the vast number of computers is a primary limitation in the ability to increase the density of computers in a given location, availability of computer racks having an improved heating management structure may overcome this problem and allow computer operators to place more computer racks in a given space. Additionally, when the power supply is removed from the individual computer node, the additional space may be used to house other devices or components, and thereby improving the overall density of the server farm.

Thus, a technical solution that would allow higher computer density and at the same time improve heat dissipation of the computer cluster (e.g., improve heat ventilation and cooling of computer components) would potentially provide significant economic benefit to the operation of a server farm.

BRIEF SUMMARY OF THE INVENTION

Described here is a computing system comprised of multiple computing units housed in a computer rack, frame, chassis or cabinet, where a power supply unit or apparatus is provided in the computing system for distributing electrical power to support the various computing units in the rack. Preferably, the power supply system is located on the upper portion of the computer rack. More preferably, the power supply unit is located on the top portion or on top of the computer rack.

In one aspect of the present invention, the power supplies are centralized at or close to the top of the computer rack. Preferably, the power supplies are located above all the computing units in the computer rack. The centralized power supply units positioned at the upper portion of the computer rack may be configured as one functional unit and supply electrical power to all the computing units in the rack. Alternatively, the centralized power supply unit may comprise of two or more modules, with each module supplying electrical power to a subset of computing units within the rack. In another variation, the two or more modules that comprises the power supply unit work together to provide the power to all the computing units in the rack.

Although in some design variations the power supplies are placed in a centralized location on the top shelf of the computer rack, in other variations, the location of the power supplies may vary. The power supplies may be grouped in two or more groups and placed on various locations on the upper portion of the computer rack. For example, two separate power supply units may be placed in the top two shelves of the computer rack. The two separate units may be configured to function as an integral unit for supplying electrical power to the various computing units in the rack. Alternatively, the two separate units may be configured to function independently of each other with each unit responsible for its own subset of computers within the rack. In another variation, one unit may be place in the top shelf while the other unit placed on top of the computing rack. As one skilled in the art would appreciate, various other configuration for placement of power supply unit at the top portion of the computing rack may also be possible in light of the discussion here in.

In another variation, a dual column computer rack is provided for housing various computing units. The computing units are placed in two columns in a back-to-back configuration within the rack. Preferably, the back sections of the two columns of computers face each other at the center of the rack and a space may be provided in between for ventilation purposes. Air suction or air compression devices may be provided to remove or replace the air in the center space column. The air suction or air compression device may be placed on top or at the bottom of the computing rack. The computing units may be configured for frontal access, such that the front of the back-to-back mounted computing units may be serviced from the front and back of the dual column computer rack.

By placing the power supplies at the top portion of one or both of the dual column rack, one may decrease or eliminate the need for a power supply module in each of the computing units housed in the computer rack. In addition, this may improve the heat dissipation efficiency of the dual column computing system. Each of the computer columns may be supported by a separate power supply unit placed on the top shelf of each column. As discussed earlier, the power supply unit may comprise of one or more power supply modules. Alternatively, both columns of the computers in the rack may be supplied by a single power supply unit placed on the top shelf of one of the columns. Furthermore, it may also be possible to place the power supply unit or units on the top of the dual column computer rack.

Computer racks supporting three or more columns of computing units or servers may also be beneficial. The computer rack may be configured such that the various columns of computers face outward, and the back sections of each column of the computers faces inward toward each other. A space may be provided at the center of the various columns of computers for ventilation of heated air. Each column may have a power supply unit placed on the top shelf of the column for supplying electrical power to the various computers in the column. Alternatively, a centralized power supply unit may be provided to supply all the power to the computers in the various columns in the rack. The centralized power supply may be placed within one of the columns in the rack or it may be placed in a separate rack dedicated for the power supply. The power supply may also be placed on top of the multi-column computer rack.

Multiple single column racks with power supply units located at the top portion of the rack may be placed in a row for easy servicing. A cooling mechanism for cooling all the power supply units in the various racks may be provided. For example, a conduit with coolant may be routed through the upper portion of the various racks to provide a medium for removing heat form the various power supply units. Alternatively, a dedicated air column may be directed to flow around the various power supply units to facilitate the removal of heat that built up around the power supplies.

As one skilled in the art would appreciate, the dual column back-to-back configuration racks may also be placed side by side in a row. A space may or may not be provided between the racks. One or more cooling mechanisms may be provided for cooling the various power supply units located in or on top of each of the duel column computer racks.

There exists a need for improved cooling of computers, especially where large numbers are provided. This need is compounded by increased computer density. Features of the invention may help meet this need. In certain situations, the need to maintain acceptable thermal level inside the computing units can compete with the need to maintain the environment in which the computers are housed at an acceptable temperature without exorbitant expenditures for environmental cooling. Various features of the invention directed at cooling the computers may help in this regard.

By redistributing the power supplies in a computer rack to facilitate heat removal from the computer rack, one may provide significant advantages to both the efficiency of each individual computing unit within the rack and the efficiency of the computing system comprised of the various computing units in the computer rack. In addition, with one or more parts of the power supply components removed form individual computing units, the computing units may be enclosed in casings of smaller dimensions, thus more computing units may be placed in a given computer rack. Furthermore, having computer racks with improved heating management structure, computer operators may be able to place more computer racks in a given space.

BRIEF DESCRIPTION OF THE DRAWINGS

In the accompanying drawings, reference characters refer to the same parts throughout the different views. The drawings are intended for illustrating some of the principles of the computer rack with a power distribution system and are not intended to limit the invention in any way. The drawings are not necessarily to scale, emphasis instead being placed upon illustrating the depicted principles in a clear manner.

FIG. 1A illustrates one variation of a computer rack with power supply modules installed at the top portion of the computer rack for providing power supply to support the computing units installed in the lower portion of the rack.

FIG. 1B is a frontal view of the computer rack shown in FIG. 1A. An optional electrical power adapter (e.g., a power distribution bar) having various sockets for distributing electrical power from the power supply modules to the computing units in the lower rack is shown.

FIG. 2 illustrates another variation of a computer rack with a electric power distribution system placed at the top of the rack for supporting the electrical needs of the computing units in the rack.

FIG. 3A illustrates a side view of one variation of the dual column computer rack where the two column of the computers are placed back-to-back in the racks with the power supply modules placed at the top self of each rack.

FIG. 3B illustrates a cross-sectional view (from the side of the rack) of a dual column computer rack having all the rack space below the power supply units occupied by computing units. A space is provided between the two columns of computing units.

FIG. 3C illustrates another variation of dual column computer rack with the power supply units placed on the top of the computer rack.

FIG. 8D illustrates another variation of electrical connection where at each node on the main power supply bar a set of three voltage convert is provide to provide three separate DC supply lines with corresponding voltage of 12V, 5V and 3V. Each computing unit in the system receives power supply from each of the three levels of DC power supply.

FIG. 9 illustrates another variation of electrical connection where six power supply modules are configured in a parallel manner to provide electrical power to two power supply bar, where each power supply bar supports a plurality of computing units. In this variation, the voltage step-down converter is provided within each computing unit.

DETAILED DESCRIPTION OF THE INVENTION

Figure 4:
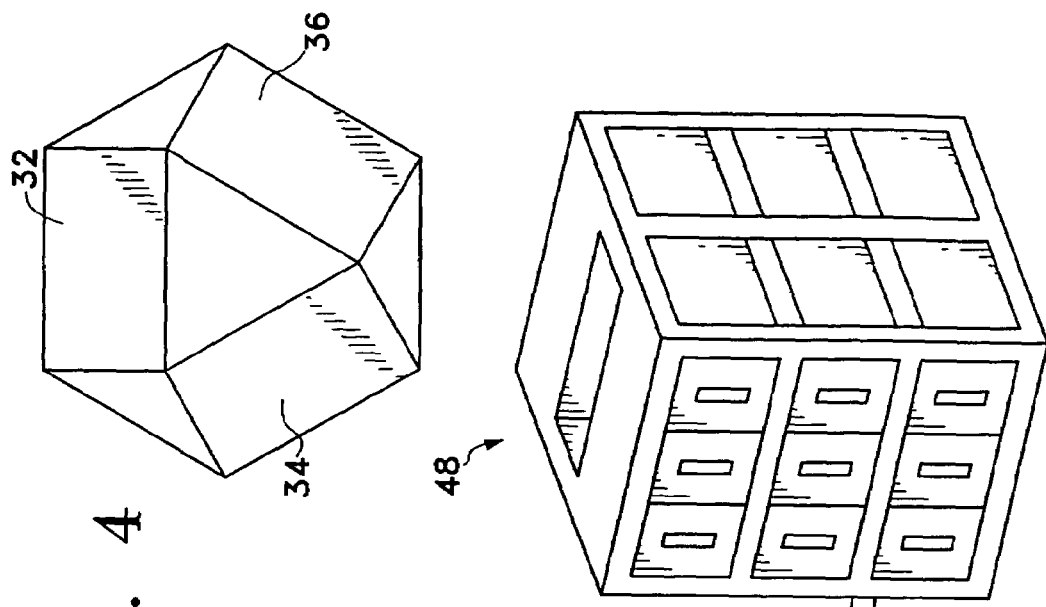
FIG. 4 illustrates the top view one variation of a computer rack having a three column back-to-back configuration.

Before describing the present invention, it is to be understood that unless otherwise indicated this invention need not be limited to applications for housing and operating servers, as such may vary. Server farms and server racks are used here as examples. It is understood that some variations of the invention may be applied to other applications where large numbers of operating computers or data storage arrays are placed in close proximity of each other (e.g. telecommunication centers, where a large number of network computer are place in the same room for routing phone calls or mange data transfer).

A computer rack is used herein as an exemplary application to illustrate the functionality of the different aspects of the invention disclosed herein. It will be understood that certain variations of the present invention may be applied in a variety of applications for housing and/or operating a large number of electronic devices or systems in close proximity of each other.

The term "computing unit" is used herein to include any electronic system designed to perform computation or data storage functions, including but not limited to, an electronic device having a CPU, a computer, a server, a work station, a programmable electronic device, data storage devices, a data storage arrays, or a data processor. A computing unit may be encased in a casing or box. Alternatively, the computing units may be built on electronic boards or blades without enclosures. In some variations, a backplane may be provided in a computing rack such that the computer boards or blades may be inserted on the backplane directly.

It must also be noted that, as used in this specification and the appended claims, the singular forms "a," "an" and "the" include plural referents unless the context clearly dictates otherwise. Thus, for example, the term "a computer" is intended to mean a single computer or a combination of computers, "an power supply unit" is intended to mean one or more power supply units, or a combination thereof.

Referring to FIG. 1A, an exemplary computer rack 2 having a power distribution unit 4 installed in the top shelf of the rack 2 is shown. In this variation, the power distribution unit 4 is comprised of three power supply modules 6. The power supply modules 6 are configured to support the computing units 8 that may be placed in the lower shelves below the power supply modules 6. In FIG. 1A, as shown, two computing units 8 are secured within the computer rack 2. An electrical supply line column 10 (e.g., a power distribution bar) may be built into the rack for directing electricity from the power supply modules 6 to the computing units located below, as shown in FIG. 1B. The electrical supply line column 10 may have individual sockets 12 such that when a computing unit is slid into a shelf in the rack 2, a corresponding socket on the computing unit will couple with the socket on the electrical column such that electrical connection may be achieved. As one skilled in the art would appreciate, other built-in electrical connections that are commonly used in the industry may be adapted in the frame of the computer rack so that when a computing unit is inserted or secured onto the rack the computing unit may be plugged into the socket to receive electrical power from the power supply, and a separate electrical cable would not be needed. Alternatively, electrical cords or cables may be used to provide electrical connection from the computing units to the power supply modules.

The three power supply modules may work together to supply electrical power to all the computing units in the rack. They may be configured as an integrated power supply unit to provide electrical power to all the computing units in the rack, or they may be configured such that each modules is primary responsible for a subset of computing units in the rack. The modules may also provide failover protection such that when one of the modules fails, the other two modules may take over and maintain electrical power to all the computing units in the rack. The power supply system positioned on the upper portion of the computer rack may have a microprocessor controller for controlling power distribution to all the computing units in the rack. Alternatively, each of the three modules may have its own microcontroller for controlling power distribution. The individual controller in each power supply may be configured such that they are capable of communicating with each other and function as an integrated power supply unit.

Vents may be provided on the front and/or back panel of the power supply modules such that air can easily flow through each power supply module. Fans and/or other heat removal mechanisms may be implemented in or around the power supply module to prevent the electronic components within the power supply module from overheating.

Each power supply module may be configured with one or more of the following functionality or features: redundant functions, hot swappable features, hot-pluggable feature, uninterruptible power supply (UPS) feature, load sharing with other modules, warning system (e.g., alarm, buzzer, LED display, LCD display, power defective signal, etc.), system status indicator (e.g. LED display, LCD display, data output port for communicating with a computer, a monitor, or a display mechanism, etc.), thermal protection (e.g. redundant cooling fans, thermal alarm, automatic over-temperature shutdown, etc.), feed back control mechanisms (e.g., sensors for monitoring current level at output current supply line or at the power distribution bar), management interface for communicating with a central controller or computer to support remote control and management of power supply output, one or more AC input ports, and one or more DC output ports.

In one variation, all power supply management functionality provided in a conventional power supply module located in a computing unit or server box is removed and the centralized power supply unit located at the upper portion of the computer rack configured to provide all the power supply management needs. Alternatively, only part of the power supply management functionality provided in a conventional power supply module located in a computing unit or server box is removed and the centralized power supply unit located at the upper portion of the computer rack is configured support the scaled down version of the individual power supply module in each computing unit. This configuration may allow the size of the power supply module in each computing unit to be significantly reduced. As the result, the size of the overall computing unit may be decreased. Alternatively, with the size of the power supply module reduced, extra space may be available for implementation of additional device (e.g., a hard drive) in the computing unit.

Many of the traditional power supply modules have a large transformer block for transforming the supplied AC current to DC current which is in turn supplied o the individual components in the computer. The transformer radiates significant amounts of heat such that a dedicated fan is often needed to cool the transformer. In one variation, the transformer is removed from the computing unit and AC to DC conversion is managed by the centralized power supply unit positioned on the upper portion of the computer rack. The centralized power supply unit may supply DC current to each of the computing units in the rack. By removing the transformer, a major heat-generating component is removed from the computing unit. Furthermore, with the transformer block removed, the electronics needed to manage the incoming electrical current may be built directly on to the motherboard or onto an adapter card that can be connected to the motherboard, and a bulky power supply module may no longer be necessary. By removing the power supply module, which usually takes up a significant amounts of the room within a computing unit's casing, the computing unit may be built with a slimmer profile, thus allowing more computing units to be placed on a given computer rack.

In addition, having the power supply positioned at the upper portion of the rack, one of the key heat generating factors in the multi-computer system housed in a computer rack is centralized and positioned at a location for efficient heat dissipation. The heat generated by the centralized power supply unit positioned at the upper portion of the rack may dissipate heat more efficiently since heat generating components and other barriers located above it may be minimized. In addition, heated air tends to move upward, and having the power supply positioned at the top or close to the top of the rack may allow the heated air around the power supply to leave the computing rack faster. Further more, since the power supply is centralized in the rack separated from the other computer components, a separate and dedicated cooling mechanism, such as a cooling agent conduit or a dedicated fan or air flow column, may be provided to cool the centralized power supply unit.

In another variation, the centralized power supply unit is configured to receive high voltage input and regulates the distribution of electrical power to various computing units in the computer rack. In one variation, the voltage is stepped down in the centralized power supply and a regulated AC current is supplied to the computing units supported by the rack. An AC to DC converter is provided within each computing unit to receive the distributed AC current supplied by the centralized power supply unit. In another variation, an integrated circuit based miniature AC to DC transformer is placed in each computing unit for receiving incoming current from the centralized power supply. The miniature AC to DC transformer (e.g., solid state AC/DC transformer) may be integrated on an adapter card for placement on the motherboard of the computing unit. Alternatively, the miniature AC to DC transformer may be mounted directly on the motherboard.

As discussed earlier, the centralized power supply unit may comprise of one or more power supply modules. The power supply modules may be configured to provide redundancy, such that when one power supply module fails the electrical power to the computing units in the rack will not be interrupted. The power supply modules may be configured for easy removal and replacement as one skilled in the art would appreciate. In one variation, the power supply modules are configured in such a way that "hot-swap" or hot-exchange is possible. This may allow system administrator to replace one or more of the power supply modules without interrupting the ongoing computing functions that are taking place in the computing units supported within the rack. The power supply modules may be configured to provide load sharing to support a desired voltage and current level to a power supply line. Each power supply modules may have its own sensors and feed back mechanisms to regulate is current output. A controller unit may be connected to regulate the current out of all the modules in the system. For example, the controller may monitor the current level in a power supply line (e.g., electrical supply line column) and modulate the current output of each individual power supply module. Some of the power supply modules may be turned off or put on standby mode when the power demand of the computing units is limited.

In another variation, the power supply unit 4 is placed on top of the computer rack 2 as shown in FIG. 2. In this example, the power supply unit 4 is comprised of three power supply modules 6. Optional cooling mechanisms may be provide for removing heat directly from the electronics components in the modules or for removing heated air that surrounds the components in the power supply module.

One way to conserve space and increase computer density is to eliminate the need for access to both the front and back of a computer. This is accomplished by a rack or chassis design in which ports for items requiring physical access are placed only at the front of the chassis. Items requiring physical access include, but are not limited to: various data drives or storage devices and physical input and output sockets. Preferably, the rear of a computer chassis made according to the invention is free of any such access ports. However, in some variation, this "front access" feature does not require that each and every physical attachment to a computer be located in front of the machine. Those components which require physical access periodically or would significantly hinder forward removal of devices from a computing unit, may be provided for at the front of the computing unit. Those features located on the main board, which would normally be accessed from behind and accessible data drives may be provided for in the front of the inventive chassis. In another variation, those feature which are to be accessed while the computer is operating are provided on the from of the computing unit, while the features which are only accessed when the computer is shut down are provide on the back of the unit.

The above-described computer rack configuration allows for effective placement of computer components in a back-to-back arrangement within a rack or other supporting structures. This back-to-back placement allows the configuration of a computer rack for housing two columns of computers. Such placement often doubles or further multiplies the density potential for rack computer systems, e.g., those in which the computers would otherwise be mounted one unit deep. The back-to-back mounting of computer chassis may also involve the back-to-back placement of full-function computers linked to one another or the back-to-back placement of a computer and a device such as a drive array serving the computer that it abuts.

Furthermore, by placing the inventive chassis in a back-to-back fashion in a manner so that a space between the backs of the two columns of computer is present when the computing units are in a rack may provide a conduit for venting heated air from the dual column rack. Cooled or forced air may then be provided into this back space between the two columns of computing units (and, if so desired, to the space between the sides of the chassis and side panels of some racks) to pass through a computer chassis and be vented through the front of the machine. This back-to-front flow of cooling gas traveling through the computer may be directed to particularly hot-running or temperature-sensitive components such as power supplies or CPU's. Various inlets, vents, fans, and baffles may be specially-configured or controlled to provide desired flow properties and optimize cooling and/or temperature stabilization. Forced air at ambient temperature or forced and/or cooled air as low as about 40 degree Fahrenheit (or about 5 degree Celsius) or lower may be used. Air provided in the space between computers and or the rack which house them may come either from above through ductwork typically present in a building or below where advantage may be taken of the fact that heat rises.

The backspace and optional side-space between the computers or rack sides may be used in another advantageous manner. Especially where maintaining a lower environmental temperature is a concern, a flow reversed from that described above may be advantageous. Such reversed flow may be accomplished by drawing ambient air by fans and/or a partial vacuum through the computer chassis past heat-generating components and venting it from the common space between the computers by a hood or plenum, vent or other means. Alternatively, each computing unit in the rack may have its own fan to drive the air inside the housing of the computing unit into this space between the two columns of computers. Common ductwork may be utilized to remove the heated air from the space between the two computer columns and direct the air out of the environment surrounding the computers or into an air-conditioning unit to cool the extracted air. Alternately, each hood may independently exhaust air out of the site in which the computers are located. Providing front-to-back flow will cool computer components as well as help maintain lower ambient temperatures than possible with other high-density network computer solutions. As desired above, flow of cooling gas may be directed to or by the hot-running or temperature sensitive components.

Providing cooling flow in either a back-to-front direction or a front-to-back direction is possible with the hardware and/or configuration of computers and racks as disclosed herein. Various methods and hardware components either in isolation or in combination may be provided to work together to ultimately achieve the desired results.

An exemplary apparatus utilizing a dual column computer rack 22 configuration is shown in side-view in FIG. 3A. In this variation, the computing units 8 are to be placed into the two columns in a back-to-back configuration. FIG. 3B illustrating a cross-sectional view of a dual column computer rack system with all the shelves filled with computers. The back sections 23, 24 of the two columns 25, 26 of computers 8 face each other at the center section 28 of the rack. In this example, the top shelf of each rack is reserved for the power supply modules 6. An optional electrical conduit 10 may be provided to direct current from the power supply modules to the various computing units that are placed below it. The electrical conduit 10 may have sockets for easy connection with the individual computing units.

Although in the above example, the dual column configuration is shown with computing units placed in the back-to-back configuration, one skill in the art would appreciate that a front-to-front configuration where the front-sides of the computing units are facing each other in the center of the compute rack is also feasible. In this variation, air flow may be forced into or extracted out of the space between the two columns of computing units to facilitate air flow across the electronic components within each computing units. In another variation, the dual column configuration comprises of computing units placed in a side-to-side configuration where the sides of the computing units faces each other at the center of the computer rack. In another variation, some of the computers in the dual column rack may be placed in the back-to-back configuration while some are placed in a front-to-front fashion or in a side-to-side fashion. Furthermore, when power supply modules are placed in a dual column configuration, they may also be placed in a back-to-back configuration, side-to-side configuration or front-to-front configuration.

In the variation shown in FIG. 3B, each of the computers is aligned with a corresponding computer in the other column, however, the computing units in the two columns within the dual column rack need not be aligned with each other. For example, in one variation, all the computing units in one column may be misaligned with all the computers in the corresponding column. In another variation, some of the computers are align with a corresponding computer in the other columns, while others are not.

In one variation, a dual column back-to-back rack is configured with six DC power supply modules. Three of the power supply modules are placed on the top shelf of the front column, while the other three power supply modules are place in the top shelf of the back column. Each of the power supply modules is configured to receive either a 110 Volts AC input or a 220 Volts AC input. Each power supply module may be configured as a 3000 Watt power supply or a 5600 Watt power supply. Each of the power supply modules may be configured to maintain a 56 Volts DC output. The outputs of the power supply modules are connected to a power distribution bar in a parallel manner such that load share may be balanced throughout six modules that are operating. Each of the power supplies is connected to a sensor adapted to monitor the amount of current flowing in the power distribution bar. Within each power supply module there may be a built-in feedback controller for modulating the power output of the module. An optional central controller may be provided to control all six of the power supply modules. The central controller may be placed in one of the lower shelves in the dual column rack. The central controller may have an external sensor adapted to monitor the electrical flow in the power distribution bar. Electrical connections are provided from the central controller to each of the six modules such that the central controller may communicate with all six of the power supply modules. The central controller many control the power output of the individual power supply modules to ensure that the appropriate amount of power is being supplied to the computing units in the rack. For example, when the overall power needs of the computing units are low, the central controller may only turn-on or activates two power supply modules. As the power demand of the computing units increase, the central controller may turn-on or activates more power supply modules as needed. As the power demand of the computing units decreases, the central controller may instruct individual power supply module to shut-off or go into the stand-by mode. In this variation, the power distribution bar runs down the center section of the dual column rack to provide electrical power to all the computing units in the front and back column of the computer rack. The power distribution bar may comprise one or more conductive strips running in parallel of each other. A 48 Volts DC converter card is provided to step-down the input voltage supplied by the power distribution bar and provide three outputs (12V, 5V and 3V) to power the electronic components in each computing units. In one configuration, the three outputs, 12V, 5V, and 3V, have corresponding Amperage ratings of 30 A, 20 A and 20 A. The DC converter cards may be placed inside each of the computing units and connected directly to the motherboard of the computing unit. Alternatively, the DC converter cards are placed outside of the computing units, and electrical cords or connections are provided to deliver the output electrical powers onto the mother board of each of the corresponding computing units. For example, a slot may be provided in the computer rack next to each computing unit for placement of a DC converter card to support each computing unit. Fans may be provided on top of the rack to assist the removal or displacement of heated air located in the space between the two columns of computers. A hood may be placed on top of the fans to direct heated air away from the computer rack. For example, the hood may be connected to an air duct to facilitate the removal of heated air from the computer rack.

In on variation, a fan is placed above the power supply modules such that air is drawn from the bottom of the dual column computer rack, through the space between the two columns of computers, and then passing around or through the power supply modules before exiting the computer rack. Individual fans may be provided at each of the computing units in the dual column rack to push heated air out of the computing units and into this air stream being created in side the space between the two columns of computers. Alternatively, the air may be blow into the space between the two columns by a set of fans positioned at the bottom of the computer rack.

In another variation, the electrical power supply units 4 are placed on top of the dual column computer rack 22, as shown in FIG. 3C. In this example, each unit is comprised of two power supply modules and each unit is configured to supply electrical power to all the units placed in the column below it.

In one variation, the power supply modules are placed above the space between the two columns of computers. A set of fans may be place above the power supply modules such that air are drawn out of the space between the two columns of computers and through the power supply module and then exit the computer rack system.

In another variation, the dual column back-to-back format is formed by placing two single-column computing racks in a back-to-back configuration. Frames or other supporting structures may be provided to secure the two racks to each other. A space may be provided between the two racks such that heat may be vented from the space between the two racks. Each of the computing racks may have an upper shelf configured for housing one or more power supply modules.

In yet anther variation, a computer rack or chassis comprising of three or more columns of computing units or servers may be provided. For example, three columns of computers 32, 34, 36 may be placed in a back to back fashion such that the back section of each the computer columns faces the back section of the two other column of computer in a sixty degree angle. FIG. 4 shows the top view of an exemplary design utilizing the three column back-to-back configuration. In this variation, the three-column system may comprise of a single rack having three columns of shelves or slots. Part of the rack may be moveable or slidable such that an operator may accesses the back of the computing units for servicing and maintenance. Alternatively, the tree column system may comprise of one or more moveable or slidable racks. In another variation, a five-column computer rack system is provided such that the five columns of computers are placed in a pentagonal configuration with an air column in the center of the five columns. Each of the five columns of computers are placed with the front of the computers facing the perimeter of the pentagonal system and having the rear sections of the computers facing the rear section of the computers in the four other columns. As discussed earlier, each rack may have a power supply unit positioned at the top portion of the rack for supplying power to the computers within the column. Alternatively, one power supply unit may be provided for supplying electrical power to the all computers in the pentagon-configuration rack. The power supply units may be placed within one or more racks, or it may be placed on top of the rack system. Alternatively, the power supply unit can be provided in a separate rack to supply power to all five columns of computers in the rack. Although three and five column configuration is discussed herein, one skill in the art would appreciate that four, six, seven, eight, nine and ten column configurations may also be possible.

In another variation, electronic apparatuses mounted in the multiple computer racks may be supported by a centralized power distribution unit mounted in a dedicated rack separate from the computer racks. Two or more computer racks may have electrical connection to the centralized power distribution unit. The power distribution unit may comprise of an integrated DC power supply unit. Alternatively, the power distribution unit may comprise of two or more power supply modules. The power supply modules making up the power distribution unit may provide load sharing electrical output to support the computing units in the various computer racks. In one variation, the power supply modules supplies a DC current to the various computer rack. The multiple modules may be turned on all the time. Alternatively, the modules may provide electrical outputs on an as needed basis and the additional module capable of producing extra power supply may be placed in a standby mode or turned off until additional power is need by the computing units. The computer racks housing the centralized power distribution unit may be a single column computer rack, a dual column back-to-back rack, or other multi-column computer rack.

Figure 5:
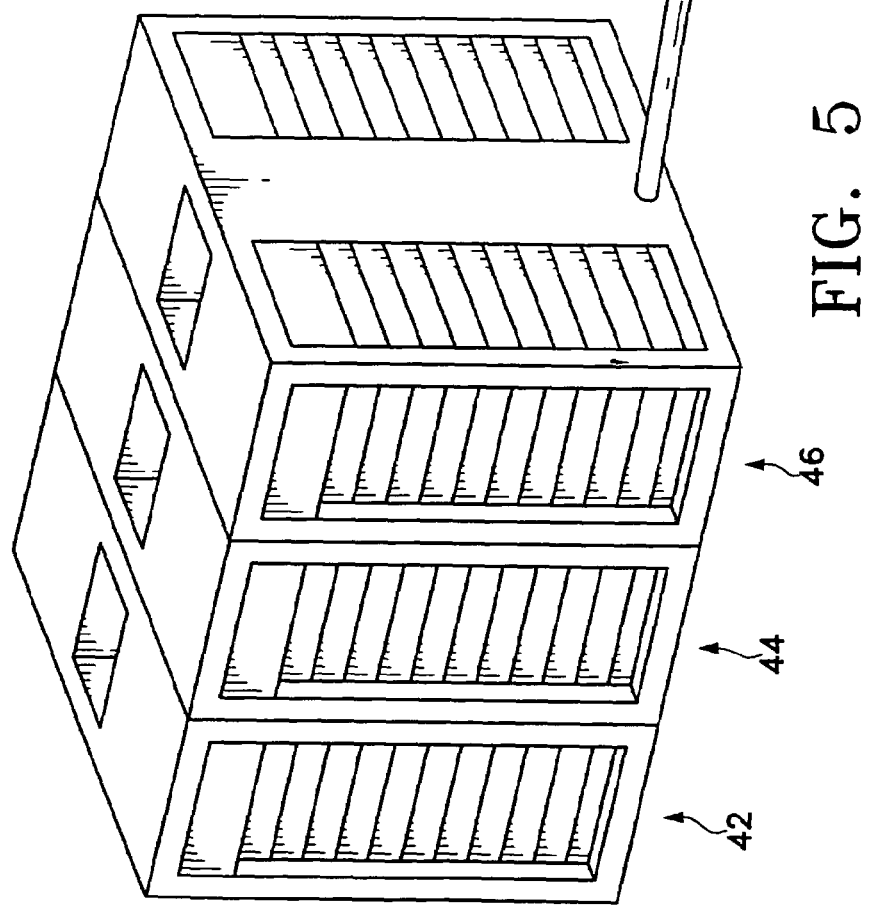
FIG. 5 illustrates one variation of a centralized power supply system where a power distribution unit provides electrical power to the computers mounted in three dual-column computer racks. In this variation, the power distribution unit comprises of DC power supply modules secured in a separate rack in a back-to-back fashion. Air flow vents and air flow channels are provided in the power supply rack for cooling the power supply modules in the power supply unit.

FIG. 5 illustrates a three-rack system supported by a separate power distribution unit. In this example, the three racks 42, 44, 46 are place side by side and a power distribution units 48 is connected to the three separated racks to provide DC currents to the computing units housed in each of the three computer racks. In one variation, the power distribution unit 48 is configured as a forty-eight volts DC power supply. In another variation, the power supply may be configured to deliver an actual voltage output of about 56 volts. Each computer rack (or each column within the rack) may have a separate voltage step down converter to step the input voltage down to about 14 Volts before the power is distributed to each of the computing units in the rack or column. A DC converter card may be provided in each computing unit to convert the 14 Volts input into a 12 Volts, a 5 Volts and a 3 Volts outputs to supply the electricity needs of the components in the computing units. Alternatively, the power distribution unit may be configure to provide a 48 Volt power supply to all the computing units in the three racks, and each computing units has a built-in 48 Volt DC converter board to step down the input voltage and provide a 12 volts, a 5 volts and a 3 volts output to the components in the computing unit. In another variation, the power distribution unit is configured as an 48 volts DC power supply, and each rack (or column in the rack) may have a voltage step down transformer for receiving the 48 volts DC input from the power distribution unit and output a 12 volt and 5 volts and a 3 volts power supply. In yet another variation, the distributed power supply unit provides a 12 volt DC supply, a 5 volt DC supply, and a 3 volts DC supply to the computing units directly, thus a step-down voltage converter is not necessary.

In the above example where the power distribution unit is located in a separate rack from the computing units supported by the power distribution unit, a dedicated cooling system or heat extraction device (e.g., fan, air flow, conduits for coolant flow) may be implemented to keep the thermal level of the power distribution unit at an efficient functional level. In one variation, an air flow channel is provided within the power distribution unit rack to facilitate air flow through the rack for preventing overheating of the power distribution unit. In another variation, the power supply modules are placed in a back-to-back configuration in a rack, and air may be forced into or extracted out of the space between the backsides of the power supply modules to facilitate air flow through the power supply modules. Cooled air may also be forced through the power supply modules to facilitate cooling of the electronic components within the power supply modules. The power distribution unit may also be located in a separate room or housing, isolating it from the computing units.

Figure 6:
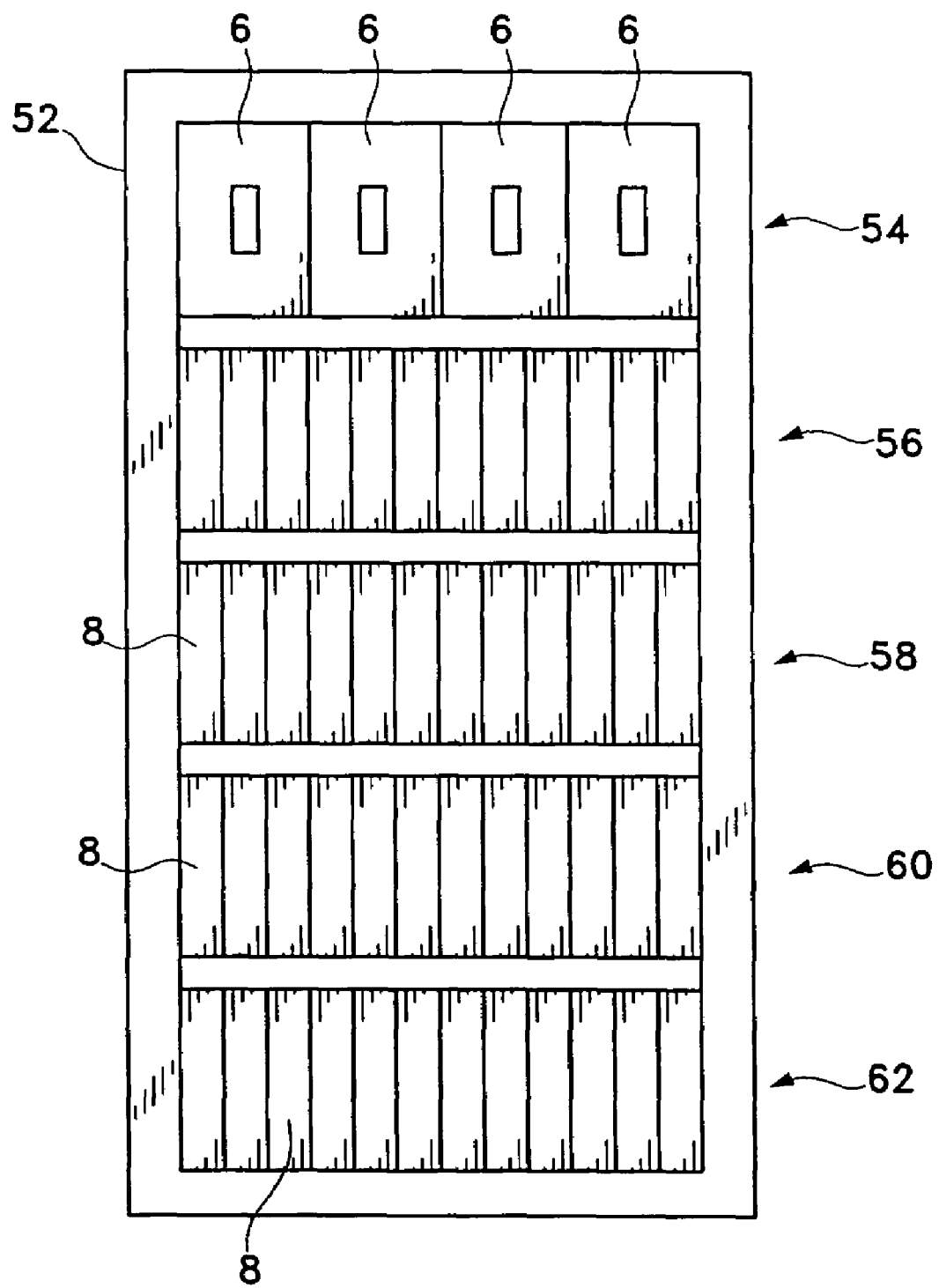
FIG. 6 illustrates one variation of a computer rack implementing a vertical stacking arrangement.

In another variation, the computing units in the computer racks are stacked vertically instead of horizontally. FIG. 6 illustrates a computer rack implementing a vertical stacking arrangement. In this example, the computer rack 52 has five rows 54, 56, 58, 60, 62, within each row of the lower four rows, computing units 8 are mounted vertically one after another in a side-by-side fashion. Power supply modules 6 are mounted at the top row 54 of the computing rack 52. As one skill in the art would appreciate, such vertical mounting of computing units may also be implemented in a two column back-to-back configured rack or other multi-column rack systems. In an alternative design, the individual computing units may be provided without an enclosure. Each computing unit may be implemented on an electronic board or blade. A backplane may be provided in the computer rack to facilitate the vertical mounting of the computing units inside the computer rack.

As one skill in the art would appreciate, the power distribution unit may be configured to provide current at various DC voltage level depending on design needs. For example, the power distribution unit may be configured to supply a DC current with a relatively constant DC voltage between the range of about 40 Volts to about 60 Volts. The power distribution unit may also have a variable DC output voltage that may be determined by the operator. For example, the power distribution unit may be configured to supply any DC voltage between the range of about 40 Volts to about 60 Volts.

DC step-down converter may be implemented to step-down the voltage as needed before the current is supply to the components in the computing units. A voltage step-down may be provided at each rack or each column. If necessary another voltage step-down converter may be provided to further step-down the voltage before the current is directed to the motherboard in the computer. Although in the above example, the 48 to 12-3-5 voltage step-down converter and the 12 to 12-3-5 voltage step-down converter are located in the computing unit. One skill in the art would appreciated that these voltage step-down converters may be located out side the computing unit to supply current with various voltage levels (e.g. 12V, 5V and 3V) to the computer board through electrical connections.

Figure 7B:
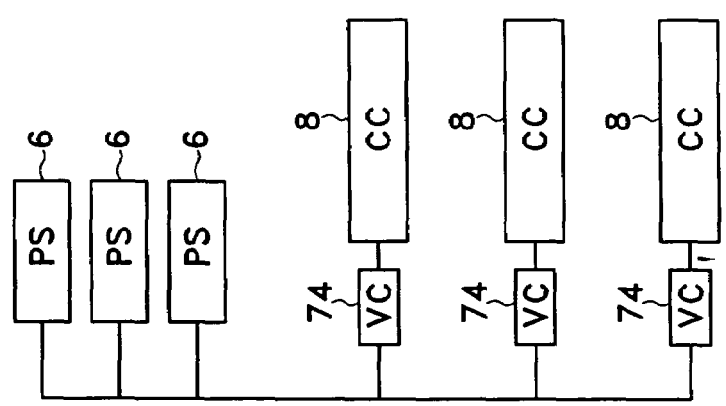
FIG. 7B illustrates another variation of electrical connection where the voltage converters are provided as separate modules connected to the computing units.
Figure 7A:
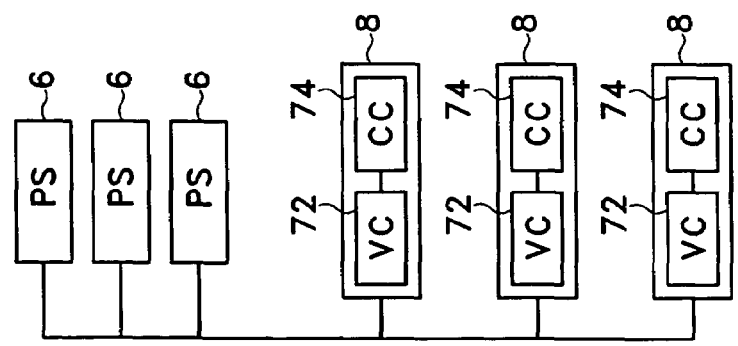
FIG. 7A illustrates one variation of electrical connection where three DC power supply modules are configured in a parallel manner to supply direct current to three computing units. Each computing unit has a built in voltage step-down converter.

One variation of electrical connection for the computer rack with a distributed power supply system is illustrated in FIG. 7A. In this variation, three DC power supply modules (PS) 6 are configured in a parallel manner to supply direct current to three computing units 8. Each computing unit 8 has a built-in voltage step-down converter (VC) 72. The voltage step-down converter 72 supplies direct currents with step-downed voltages to the computing components (CC) 74 (e.g., CPU, RAM, ROM, etc.) in the computing unit 8. As one skilled in the art would appreciate, although in this example three power supply units and three computing units are shown here, various other combinations of power supply units and computing units may also be applicable. FIG. 7B illustrates another variation of electrical connection where the voltage converters 72 are provided as separate modules connected to the computing units 8.

The power supply modules 6 may be housed in the same rack as the computing units 8. For example, the power supply modules 6 may be housed in the upper portion of the rack, while the computing units 8 are housed in the lower portion of the rack. Alternatively, the computing units 8 are housed in one rack while the power supply modules 6 are housed in a separate rack. In one variation, the voltage converters 74 are housed in the computing unit rack. In another variation, the voltage converters 74 are housed with the power supply modules 6.

Figure 8A:
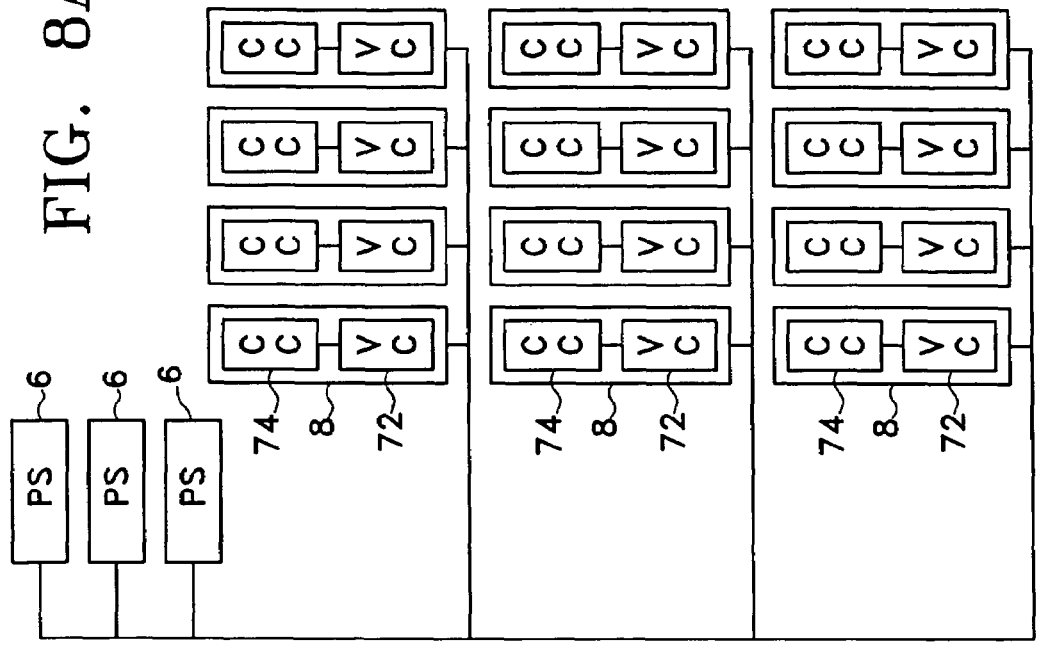
FIG. 8A illustrates another variation of electrical connection where three power supply modules supplies DC current to three power-supply bars is parallel configuration. Each of said power supply bar provides electrical power to a plurality of computing units.
Figure 8C:
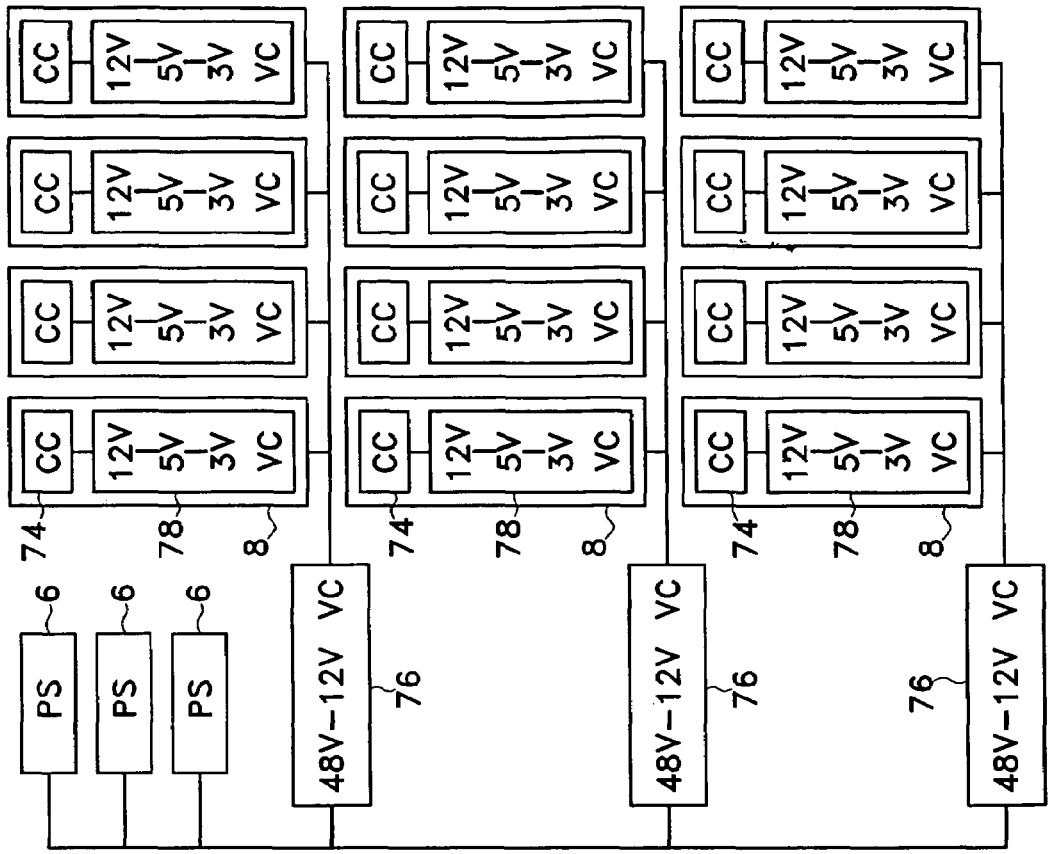
FIG. 8C illustrates another variation of electrical connection where voltage step-downs from 48 to 12 volts are provided at each of the three power-supply bars. Within each computing unit, a voltage converter with an input of 12V and outputs of 12V, 5V, and 3V is provided.
Figure 8B:
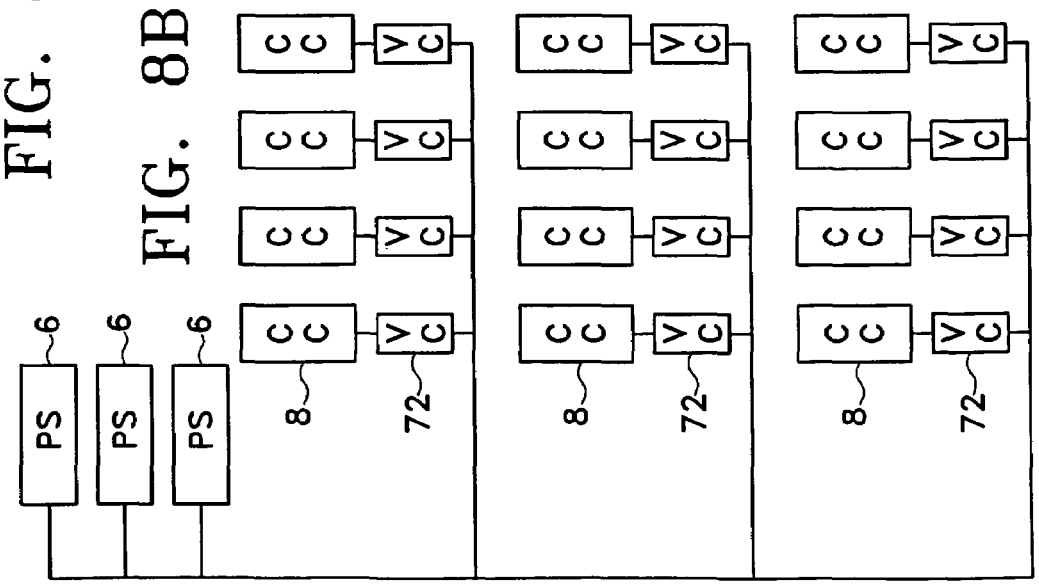
FIG. 8B illustrates another variation of electrical connection where the voltage step-down converters are located outside of the computing units.

In FIG. 8A, another variation of electrical connection where three power-supply modules 6 supplies DC current to three power-supply bars in a parallel configuration is shown. Each of said power supply bar provides electrical power to a plurality of computing units 8. The computing units in the variation shown in this example have an integrated voltage step-down converter 72. FIG. 8B illustrates another variation of electrical connection where the voltage step-down converters 72 are located outside of the computing units 8. FIG. 8C illustrates another variation of electrical connection where voltage step-down 76 from 48 to 12 volts are provided at each of the three power-supply bars. Within each computing unit 8, a voltage converter 78 with an input of 12V and outputs of 12V, 5V, and 3V is provided. One skilled in the art would appreciate that various voltage conversion configuration may be implemented here. For example, the primary voltage step-down converter 76 may provide 60V to 15V step-down, and the secondary step-down converter 78 may provide 15 Volts to 10V, 5V and 3V step-down. Other combinations may also be applicable. In addition, although in this example the secondary voltage step-down converter 78 is integrated within the computing unit, one skill in the art would appreciate that the secondary step-down converter 78 may also be implemented outside the computing unit.

FIG. 8D illustrates another variation of electrical connection where at each node on the main power supply bar a set of three voltage converts 82, 84, 86 are provided to provide three separate DC supply lines with corresponding voltages of 12V, 5V and 3V. Each computing unit 8 in the system receives power supply from each of the three levels of DC power supply 82, 84, 86. One skilled in the art would appreciate that the number of voltage converts implemented at each note is not limited to three and may be varied depending on system design needs. For example, a set of four voltage step-down converter may be used if the computer requires four separate voltage inputs. In addition, although in this example the three voltage conversions are achieved with three separate voltage converters, one skilled in the art would appreciate that an integrated unit having one voltage input and three step-downed voltage outputs may be implemented in-place of the three voltage step-down units 82, 84, 86. Furthermore, although in this example, 12V, 5V, and 3V are implemented other voltage levels may also be implemented depending on the power supply need of the computing units to be supported by the rack.

FIG. 9 illustrates another variation of electrical connection where six power supply modules 6 are configured in a parallel manner to provide electrical power to two parallel power supply bars, where each power supply bar supports a plurality of computing units 8. In this variation, the voltage step-down converter 72 is provided within each computing unit 8. As one skilled in the art would appreciate, the voltage convert 72 may also be provided as a separate module or unit outside of the computing unit 8. Furthermore, in one variation, the power supply modules 6 and the computing units 8 are housed in a dual column computer rack. For, example, the power supply modules 6 may be housed in the upper portion of the dual column rack, while the computing units 8 are housed in the lower portion of the dual column rack. In another variation, the computing units 8 are housed in one dual column rack while the power supply modules 6 are housed in a separate rack. The separate rack housing the power supply modules may also have a dual column configuration with one or more air flow channels for facilitation cooling of the electronic components within the power supply modules.

A computer server system comprising a computer rack having an electrical power distribution component located at the upper portion of the rack for supplying electricity to the various computing units in the rack may provide various benefits in the heat management of the computing units in the computer rack. First, by removing the power supply or at least a portion of the power supply or part of the power supply module, one may decrease the heat being generated at the lower portion of the computer rack, and this may also decrease the heat generated within individual computer casing or chassis. Second, since hot air tend to rise upwards, by moving the power supply or a portion of the power supply to the upper portion of the rack, the thermal dissipation capability of the computer server system (e.g., the computer rack with its various computing units installed in it) may be improved. Third, by removing or decreasing the size of the power supply module within the computing modules, the size and profile of the computer housing may be decreased and more computing units may be placed in a given rack. Fourth, by separating the power supply units from the computer systems, the heat generated by the power supply units may be drawn away from the rack more effectively with dedicated cooling mechanisms.

All publications and patent applications cited in this specification are herein incorporated by reference in their entirety as if each individual publication or patent application were specifically and individually put forth in the text.

While the invention has been described in terms of particular variations and illustrative figures, those of ordinary skill in the art will recognize that the invention is not limited to the variations or figures described. In addition, where methods and steps described above indicate certain events occurring in certain order, those ordinary skill in the art will recognize that the ordering of certain steps may be modified and that such modifications are in accordance with the variations of the invention. Additionally, certain of the steps may be performed concurrently in a parallel process when possible, as well as performed sequentially as described above.

Therefore, it should be understood that the invention can be practiced with modification and alteration within the spirit and scope of the appended claims. The description is thus to be regarded as illustrative instead of limiting on the invention.

I claim:

1. A rack mounted computer apparatus comprising:
   a rack;
   a plurality of AC to DC power converter modules mounted on the upper portion of said rack;
   a power supply line, wherein said plurality of AC to DC power converter modules are electrically connected to the power supply line in a parallel manner to supply a DC current through said power supply line;
   one or more direct current voltage step-down converters;
   a plurality of computers mounted below said plurality of AC to DC power converter modules, each of said plurality of computers is electrically connected to said power supply line to receive the DC current from said power supply line, wherein each of said plurality of computer comprises a CPU, a ROM, a RAM and a hard drive, and wherein each of said plurality of computers is further configured to receive DC current from the power supply line through the direct current voltage step-down converter located outside of each of the plurality of computers; and
   wherein said power supply comprises two or more direct current modules configured to provide fail over protection.

2. A system for distributing power to a plurality of computers housed within a cabinet comprising:
   a cabinet, wherein said cabinet defines a storage space for housing computers, wherein said storage space have a top end and a bottom end;
   a plurality of computers, each computer having a front section and a back section located opposite each other in each of said computers, said plurality of computers are placed in two columns in a back-to-back configuration inside said cabinet, wherein a center space column is formed between said two columns of computers, and each of said plurality of computer comprises a fan configured to push heated air out of the computer into the center space column; and
   a plurality of AC to DC power converter modules placed at the top end of said storage space defined by said cabinet, wherein said plurality of AC to DC power converter modules are electrically connected to each of said plurality of computers in a parallel manner.

3. The system of claim 2 wherein said plurality of computers and said cabinet cooperate to define a air flow space between said plurality of computers and to direct air flowing into said space such that a quantity of air sufficient to constitute a cooling flow for said plurality of computers enters through said plurality of computers into said air flow space then exit out of said air flow space.

4. The system of claim 3 further comprising a cooling apparatus placed next to said power supply modules configured to extract heat from said power supply modules.

5. The system of claim 3 further comprising an air conduit attached to a top end of said cabinet configured to remove air from an area surrounding the power supply modules.

6. The system of claim 3 wherein said plurality of AC to DC power converter modules are positioned in a back-to-back configuration inside said cabinet.

7. A method of distributing electrical power to computers in a computer rack comprising the steps of:

supplying an alternating current to a plurality of alternating-to-direct current transformers wherein said transformers are placed above a plurality of computing units;

providing direct currents from said plurality of alternating-to-direct current transformers to said plurality of computing units through one or more direct current voltage step-down converters located outside of the computing units connected to an electrical supply line, wherein said plurality of alternating-to-direct current transformers are connected to the electrical supply line in a parallel manner to support load sharing; and converting said direct current to a plurality of direct current outputs having two or more different voltages.

8. The method of claim 7 further comprising the step of: inducing an air flow to flow past said plurality of computing units before passing next to said transformer and exiting said computer rack.

9. The method of claim 7 wherein said plurality of computers are stacked in a two column back-to-back configuration.

10. The method of claim 9 further comprising: directing an air flow to flow through a space between said two columns from a bottom end of said computer rack to a top end of said computer rack.

11. The method of claim 10 wherein each of said plurality of alternating-to-direct current transformer is housed in a power supply module.

12. The method of claim 11 wherein at least two of the power supply modules are positioned in a back-to-back configuration above said plurality of computers.

13. The method of claim 12 further comprising: drawing heated air out of said computing units and into said air flow.

14. The method of claim 13 further comprising: drawing heated air out of said power supply modules and into said air flow.

15. The method of claim 10 further comprising: drawing heated air out of said computing units and into said air flow.

16. A method of modulating heat distribution within a computer rack comprising:

supplying a direct current to a plurality of computing units in a computer rack, wherein said computing units are configured in two columns of computing units, and said two columns are placed in a back-to-back configuration, wherein the direct current is provided by a plurality of alternating-to-direct current transformers, wherein said plurality of alternating-to-direct current transformers are connected in a parallel manner to support load sharing; and drawing a plurality of air streams to flow out of said plurality of computing units and into a column of air flowing in an upward direction between said two columns of computing units.

17. The method of claim 16 wherein said plurality of alternating-to-direct current transformers are placed above said plurality of computing units in a back-to-back configuration.

18. The rack mounted computer apparatus of claim 1, wherein said direct current voltage step-down converter is configured to provide current outputs with at least two differently voltage levels.

19. The rack mounted computer apparatus of claim 1, wherein said rack comprises a plurality of sockets electrically connected to said power supply line, and each of said plurality of computers comprises an electrical interface for engaging one of said plurality of sockets.

20. The rack mounted computer of claim 19, wherein said plurality of sockets are configured on an elongated electrical conduit extending vertically within said rack.

21. The method of claim 9, wherein each of said plurality of computing units is enclosed within a casing.

22. The system of claim 2 further comprising:
an air suction device position on a top portion of said cabinet to remove air from said center space column.

23. The rack mounted computer apparatus according to claim 1, wherein said plurality of AC to DC power converter modules are configured to provide fail over protection such that if one of the AC to DC power converter module fails, that rest of the AC to DC power converter module is able to maintain the DC current to keep each and everyone of the plurality of computers running.

24. The rack mounted computer apparatus according to claim 23, wherein each of said plurality of AC to DC power converter modules comprises a 48 volt DC output.

25. The rack mounted computer apparatus according to claim 23, wherein said plurality of computers are placed in a two-columns back-to-back configuration, and a space is provided in between the two columns for ventilation purposes, the AC to DC power converter modules are also positioned in a back-to-back manner above said two columns of computers.

26. The rack mounted computer apparatus according to claim 25, wherein each of the plurality of computers is enclosed inside of a casing, and the computers are stacked one over the other within the rack.

27. The rack mounted computer apparatus according to claim 25, further comprises an air suction or air compression device provided to remove or replace the air in the space between the two columns of computers.

28. The rack of claim 1, further comprising a secondary direct current voltage step-down converter located within each of the plurality of computers.

29. The method of claim 7, wherein providing direct currents from said plurality of alternating-to-direct current transformers to said plurality of computing units through one or more direct current voltage step-down converters located outside of the computing units connected to an electrical supply line further comprises providing direct current from the direct current voltage step-down converters located outside of the computing units to a secondary direct current voltage step-down converter located within a computing unit.

* * * * *